United States Patent [19]

Allan

[11] Patent Number: 5,022,011
[45] Date of Patent: Jun. 4, 1991

[54] APPARATUS AND METHOD FOR REDUCING THE ACCESS TIME AFTER A WRITE OPERATION IN A STATIC MEMORY DEVICE

[75] Inventor: James D. Allan, Colorado Springs, Colo.

[73] Assignee: Inova Microelectronics Corporation, Santa Clara, Calif.

[21] Appl. No.: 457,987

[22] Filed: Dec. 28, 1989

[51] Int. Cl.⁵ .............................................. G11C 11/40
[52] U.S. Cl. .................................. 365/233; 365/189.01
[58] Field of Search ............ 365/203, 204, 233, 189.01, 365/189.05, 230.06, 230.08

[56] References Cited

U.S. PATENT DOCUMENTS 4,703,436 10/1987 Varshney .
4,916,670 4/1990 Suzuki et al. .................... 365/189.01

*Primary Examiner*—Terrell W. Fears
*Attorney, Agent, or Firm*—Townsend and Townsend

[57] ABSTRACT

The invention provides an apparatus and method for reducing the access time of a memory cell after a write operation. A one-shot generation circuit generates a one-shot pulse in response to a falling edge on an external write line or a change in the state of the data signal during an inactive state of the write signal. This one-shot pulse then controls writing data into a static memory cell. Since it is not necessary to wait for the write external line to go high before triggering the end of the internal write pulse, the access time of the static memory device is reduced.

8 Claims, 5 Drawing Sheets

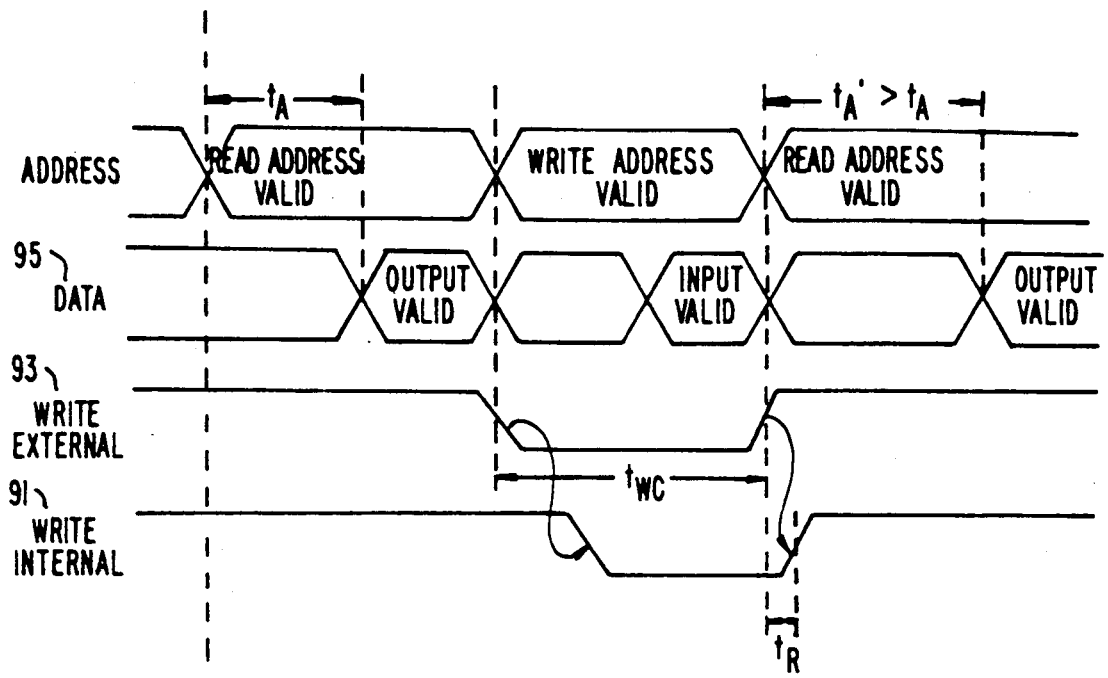
FIG._1.
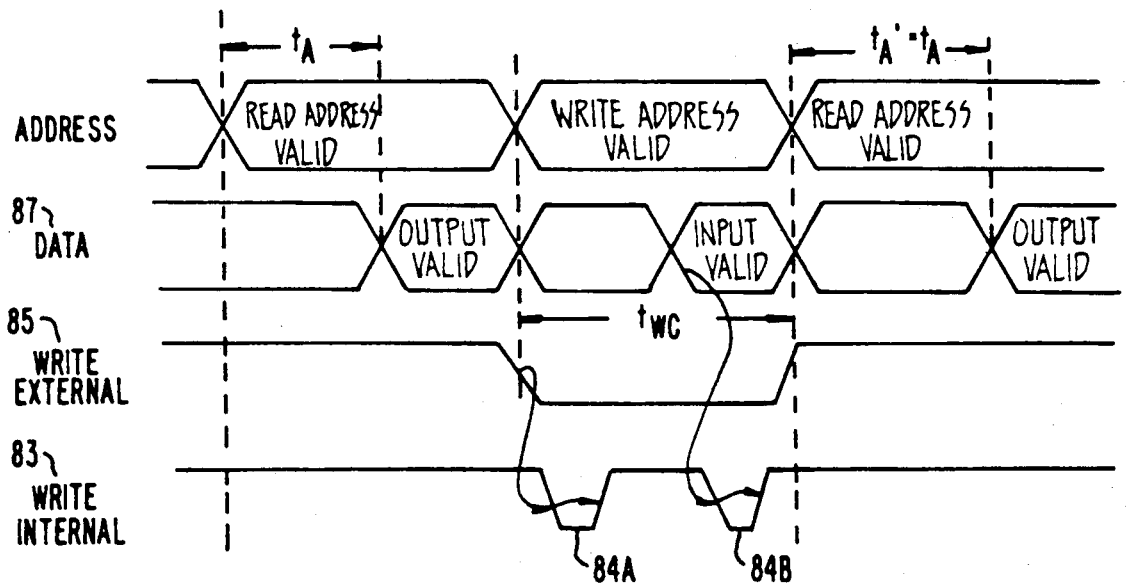
FIG._2.

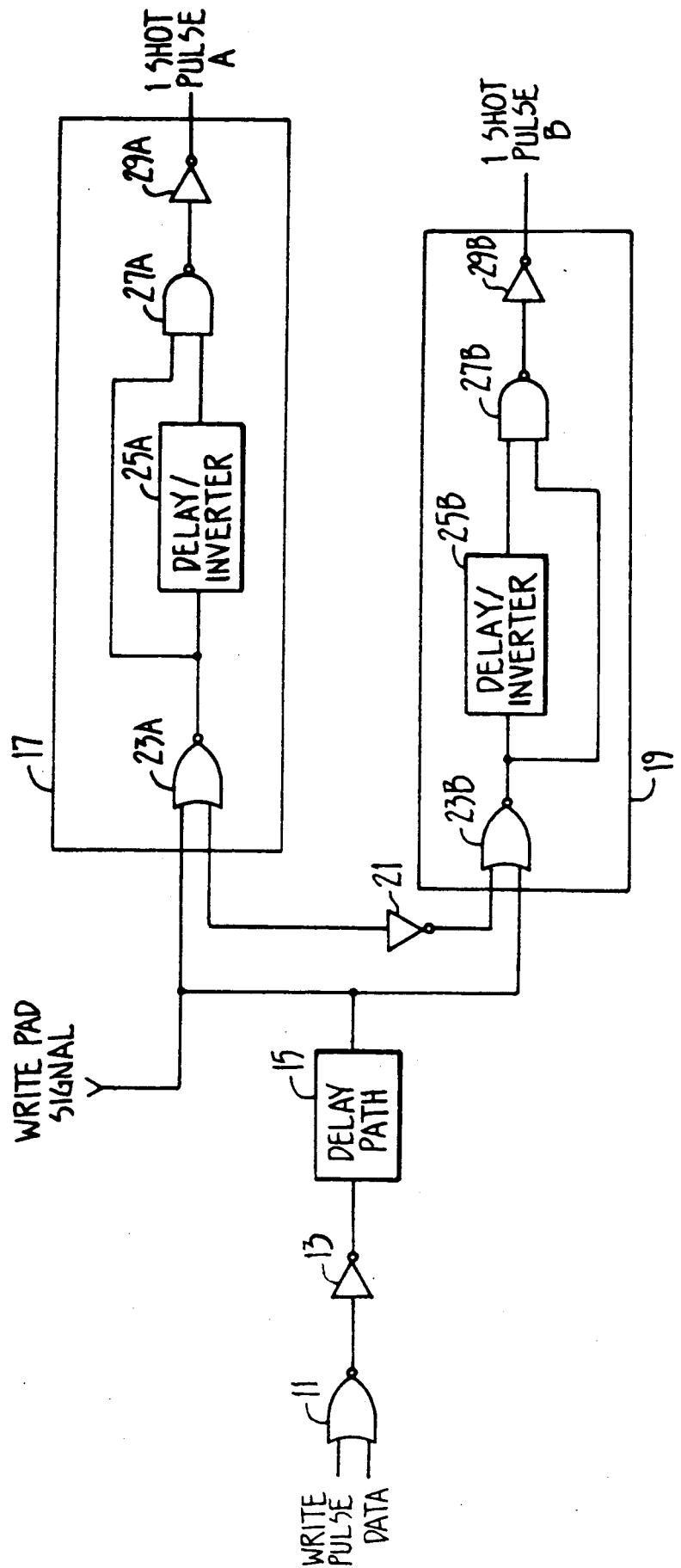
FIG._3.

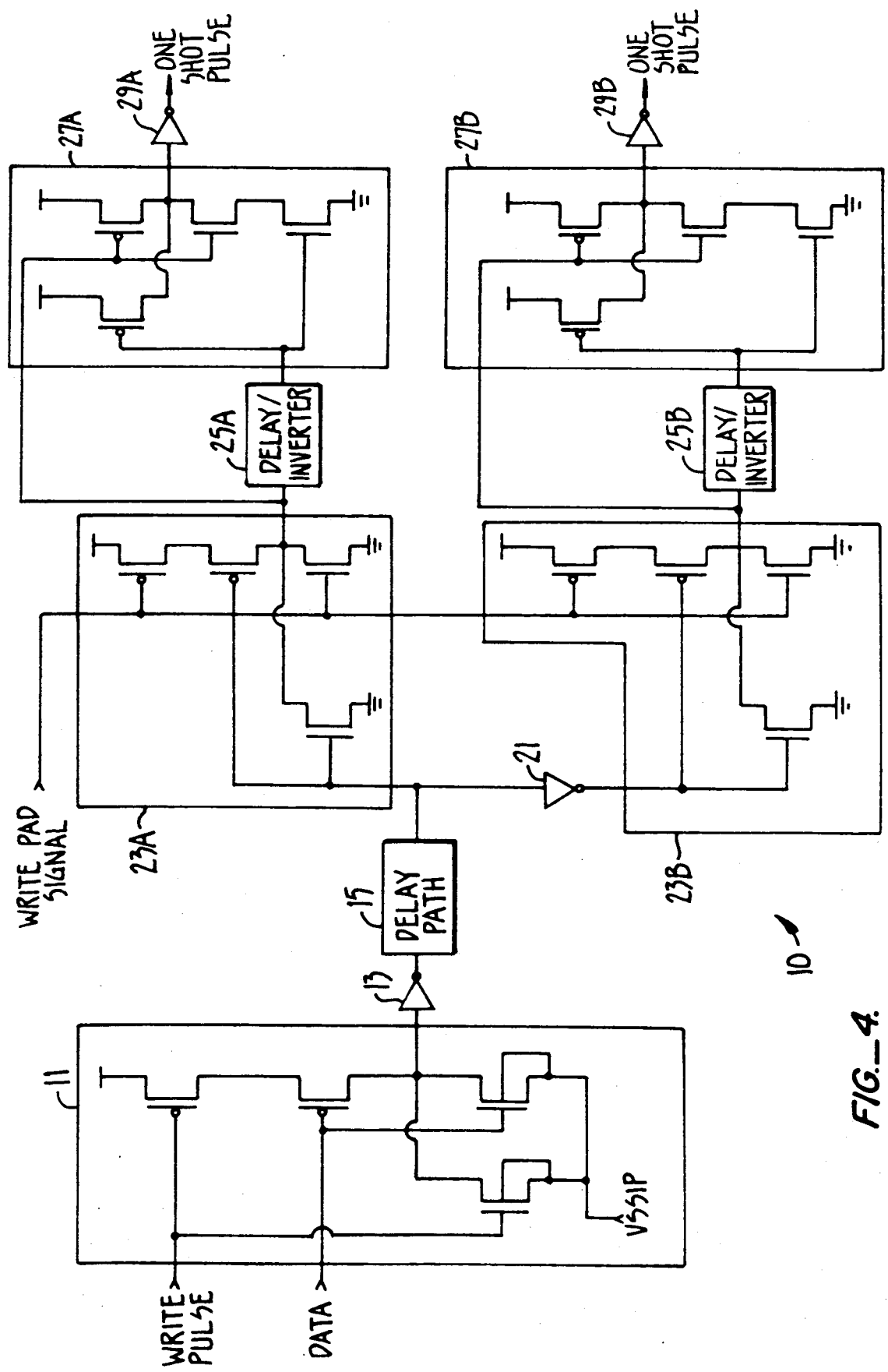
FIG._4.

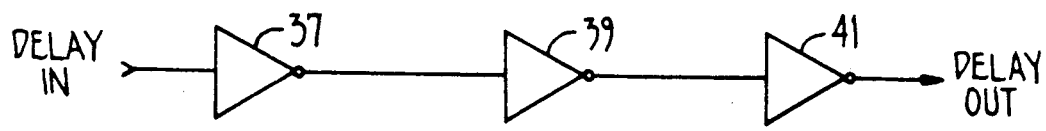
FIG._4A.
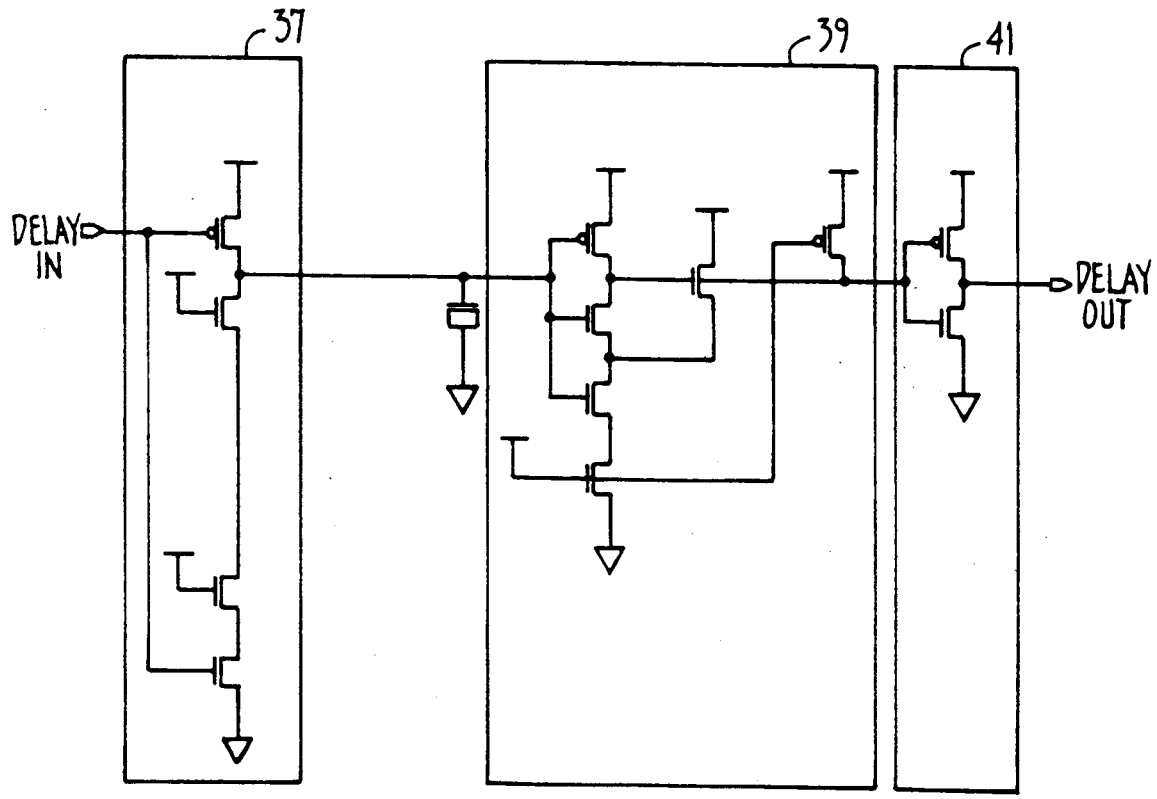
FIG._4B.

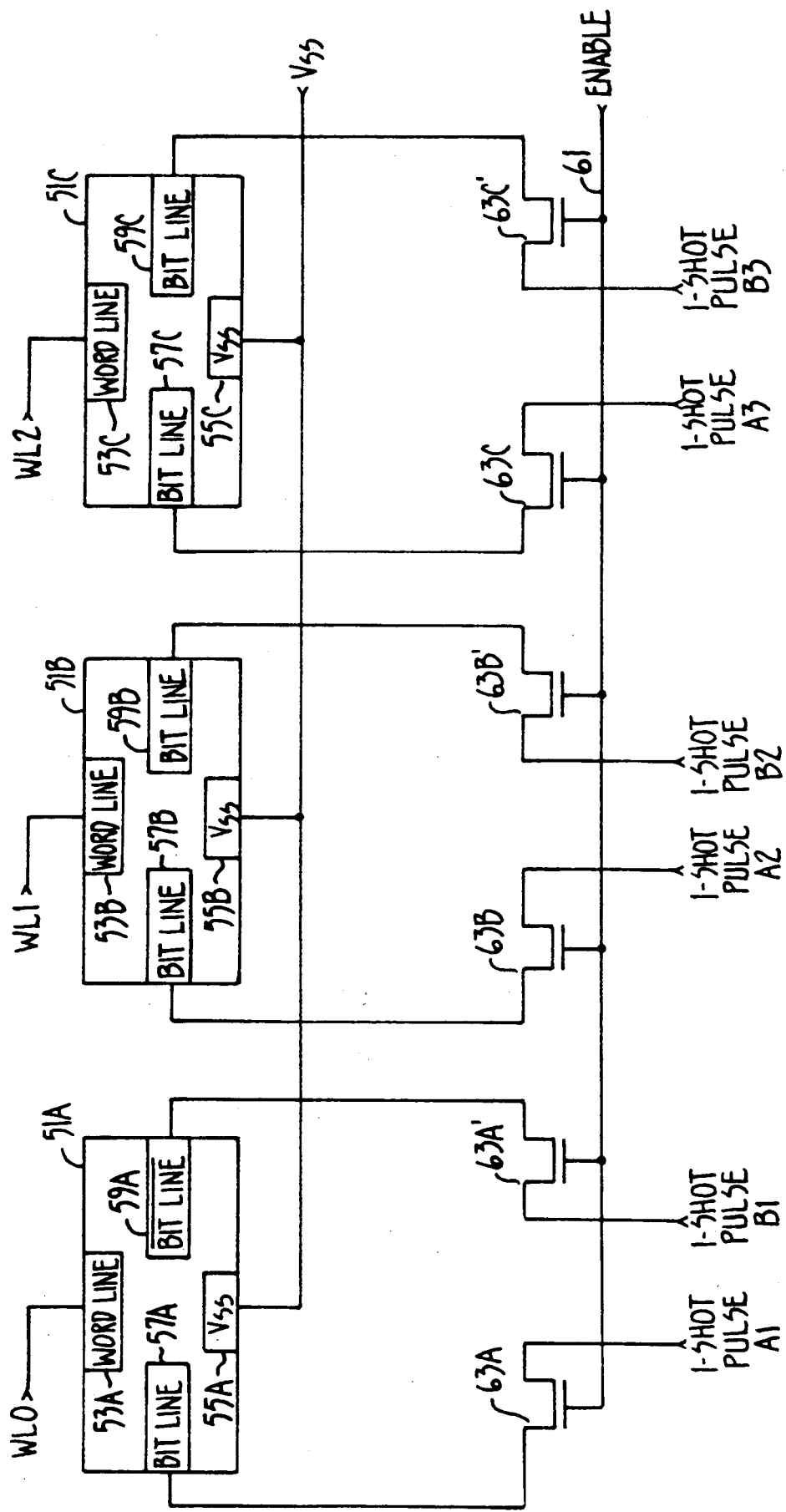
FIG._5.

APPARATUS AND METHOD FOR REDUCING THE ACCESS TIME AFTER A WRITE OPERATION IN A STATIC MEMORY DEVICE

BACKGROUND OF THE INVENTION

The present invention relates generally to static memory devices. More particularly, the invention relates to an apparatus and method for reducing the access time after a write operation in a static memory device.

Traditionally, static random access memories (SRAMs) have been designed such that a delay, known as an access time, $t_a$, must pass before data written in a cell of an SRAM can be read. A typical timing diagram for an SRAM is shown in FIG. 1. In FIG. 1 the falling edge of an internal write pulse 91 is triggered by the falling edge of an external write pulse 93. Similarly, the rising edge of internal write pulse 91 is triggered by the rising edge of external write pulse 93. By using external write pulse 93 to trigger internal write pulse 91, a read access plus recovery time, $(t_a + t_R)$, must pass before the data can be read from a particular memory cell.

The reason that recovery time $t_R$ is present is that the internal write pulse must be given time to allow for changes in data signal 95 to be written in the memory cell. By triggering internal write pulse 91 from the state changes of external write pulse 93, data changes occurring in data signal 95 are detected and written into the memory cell before write cycle, $t_{wc}$, ends. The disadvantage of holding the end of internal write signal 91 until the end of external write pulse 93 occurs is that recovery time, $t_R$, is extended beyond the end of external write cycle, $t_{wc}$. The time, $t_R$, is essentially an access time waiting period which must pass before data in the memory cell can be accessed. Waiting for access of the memory cell slows down any system in which an SRAM employing this prior art design is used. While some SRAM's are specified with $t_R = 0$, this is generally accomplished by setting the access time equal to $(t_a + t_R)$, i.e., a decrease in performance exists but is not explicitly stated on the data sheet.

SUMMARY OF THE INVENTION

The present invention provides an apparatus and method for reducing the access or recovery time after a write operation in a static RAM memory device. In particular the invention provides a system in which the write recovery time in a static memory device can be made equal to the read recovery time in the same memory device.

A reduced read-after-write access time is produced by causing the internal write pulse to be triggered by a one-shot device triggered from the external write pulse and the data signal. Using this approach, the bit lines of a memory cell have significantly longer time to recover to their read operating potential. Since the read-after-write access time is reduced, the system implementing a memory designed in accordance with the present invention can operate at faster speeds.

In a preferred embodiment the invention provides a method which includes the steps of monitoring the data signal and the write signal and generating a first internal write pulse in response to a change of state in the write signal. A second internal write pulse is generated in response to a change of state in the data signal during the current state of the write signal.

Preferably the invention is embodied in an SRAM which includes a static random access memory (SRAM) including at least one memory cell. In addition, the apparatus contains at least one data line, at least one address line, at least one enable line, a data buffer, and means connected to the memory cell. The means connected to the memory cell monitor the data line and the write line and generate pulses on the internal write line.

For a more complete understanding of the nature and advantages of the invention, reference should be made to the ensuing detailed description taken in conjunction with the accompanying drawings.

BRIEF DESCRIPTION OF THE DRAWINGS

FIG. 1 is a diagram showing the timing of the address, data, external and internal write pulses of a traditional static memory device;

FIG. 2 is a timing diagram showing the address, data, external and internal write signals of a static memory device in accordance with the present invention;

FIG. 3 is a schematic diagram of one embodiment of the circuit used to generate a one-shot pulse during which data is written to the static memory device;

FIG. 4 composed of FIG. 4A and 4B is a schematic diagram of the delay/inverter circuit used in the one-shot circuitry of FIG. 3; and FIG. 5 is a schematic diagram of the circuitry used to provide the one-shot pulse to memory cells in an SRAM.

DETAILED DESCRIPTION OF THE PREFERRED EMBODIMENTS

FIG. 2 is a timing diagram illustrating timing of the signals employed in a preferred embodiment of our invention. Preferably an SRAM employing our system monitors an external write signal 85 on a write signal line connected to the static memory device and detects a change in the state of write signal 85. This change in state represents the start of a write cycle, $t_{wc}$, and triggers a first one shot pulse 84A in an internal write signal 83. The system then waits for a change in data signal 87. If data signal 87 changes while external write signal 85 is in its present state (low) a second one-shot pulse 84B is produced in internal write signal 83 allowing the new data to be written in the memory cell during the current write cycle $t_{wc}$. The second one-shot pulse 84B will end before write cycle $t_{wc}$ expires. In contrast if there is no change in the data signal, then only a single one-shot pulse, 84A, is produced in internal write signal 83. Triggering internal write pulse 83 in one-shot pulses 84A, 84B from the beginning of write cycle, $t_{wc}$, and from changes in data signal 87 during write cycle $t_{wc}$, respectively, permits the recovery time of internal write signal 83 to be moved back so that it ends within write cycle $t_{wc}$. Thus, the present invention reduces the recovery time after a write operation thereby enabling a system using the present invention to access its static memory device faster.

FIG. 3 is a gate level diagram of the circuit used to generate a one-shot pulse during which data is written into a memory cell. A NOR gate 11 receives the external write pulse on its first input and the data on its second input. This NOR gate 11 provides a signal change on its output when the write pulse is low and the data changes state. Otherwise, the output of NOR gate 11 remains constant. The output of NOR gate 11 is transmitted through inverter 13 and delay path 15. Once the signal has propagated through delay path 15 it is split and transmitted through two paths—first path 17 and second path 19. The two paths are identical except that second path 19 receives an inverted version of the signal received from delay path 15.

The signal received from delay path 15 is fed into one input of NOR gate 23. The other input of NOR gate 23 receives a delayed write signal. The timing of this delayed write signal is set up so that it matches the delay of the address path in reaching the memory cell. This ensures that the selected cell is indeed the one being written. The NORed result of the delayed write signal and the signal received from delay path 15 is transmitted to delay/inverter 25A. In addition, the signal from gate 23A is coupled into one input of NAND gate 27A. The other input of NAND gate 27A receives a delayed and inverted signal from NOR gate 23A via delay/inverter 25A. Finally, the output from gate 27A is transmitted through inverter 29A and functions as a one-shot pulse, which is then transmitted to a memory cell.

Second delay path 19 works in the same manner as first delay path 17. The output of paths 17 and 19 are normally in a low state. When a one-shot pulse is generated by either path, the output of that path goes high. Because of the design of the one-shot circuitry the output signals of paths 17 and 19 are normally low until a one-shot pulse is triggered. At that time either one or the other of the outputs will go high transmitting a one-shot pulse to a memory cell, as explained below.

FIG. 4 is a circuit diagram of the delay/inverter 25 situated in first path 17 and second path 19 of the one-shot generation circuit of FIG. 3. Delay/inverter 25 is basically a three-stage inverting circuit. This three-stage inverter is shown in FIG. 4A. Each gate 37, 39 and 41 inverts the signal and delays propagation of the signal to NAND gate 27. The schematic diagrams for each of these inverter gates is shown in FIG. 4B.

FIG. 5 is a diagram showing three memory cells and the associated circuitry which provides the one-shot pulse to the bit lines. Each memory cell 51 receives a word line signal through an input node 53. Each memory cell 51 is powered through $V_{SS}$ input line 55 and $V_{CC}$ input line 55'.

Data is written into memory cells 51 on one of two lines. These lines are bit line 57 or complementary $\overline{\text{bit}}$ line 59. Control of bit lines 57 and 59 is carried out through gating circuitry described below. Signals on an enable line 61 enable signals to be supplied to memory cells 51. If transistors 63 are enabled, the one-shot pulse received from the one-shot generation circuit in FIG. 3 will be transmitted to either bit line 57 or $\overline{\text{bit}}$ line 59 depending on the path from which the one-shot pulse was received. For example, if a one-shot pulse is received on the drain of transistor 63A while the gate of transistor 63A is enabled by signals on enable line 61, then the one-shot pulse will be received on bit line 57. This one-shot pulse causes data to be written into memory cell 51A while allowing recovery of the memory cell for a read operation before the write cycle is completed.

The operation of the circuit of FIG. 3 will now be explained with reference to the timing diagram shown in FIG. 2. One-shot generation circuit 10 transmits one-shot pulses 84A and 84B to memory cells 51 of FIG. 6 during a write operation. First one-shot pulse 84A is triggered from a falling edge on external write pulse 85. Second one-shot pulse 84B is triggered by either a rising edge on data signal 87, while external write pulse 85 is low, or by a falling edge of data signal 87 while external write pulse 85 is low. By triggering internal write pulse 83 from a change in data signal 87 while external write pulse 85 is low, one-shot pulse 84B is able to recover before the end of the write cycle $t_{wc}$. If no change in data occurs, second one-shot pulse 84B is not triggered. The end of one shot pulse 84A recovers before the end of write cycle $t_{wc}$. Both internal write pulses 84A and 84B are completed before write cycle $t_{wc}$ is completed. This result allows for faster access to memory cells 51 after a write operation.

In general, to those skilled in the art to which this invention relates, many changes in construction and widely differing embodiments in applications of the present invention will suggest themselves without departing from its spirit and scope. For instance, the gating circuitry of FIGS. 1 and 2 may be substituted with a different configuration of the gates. Thus, the disclosures and descriptions herein are purely illustrative and are not intended to be in any sense limiting. The scope of the invention is set forth in the appended claims.

What is claimed is:

1. A method for providing a reduced access time after a write operation in a static memory device having a data signal line for receiving a data signal and a write signal line for receiving a write signal, the method comprising the steps of:

monitoring the data signal line and the write signal line;

generating a first internal write pulse in response to a change of state in the write signal representing the start of a write cycle wherein said first internal write pulse is completed prior to the end of the write cycle; and generating a second internal write pulse in response to a change of state in the data signal during a current state of the write signal representing the end of said write cycle wherein said second internal write pulse is completed prior to the end of the write cycle.

2. The method of claim 1 wherein the step of monitoring the data signal and the write signal comprises:

supplying the data signal to a first input of a NOR gate;

supplying the write signal to a second input of said NOR gate; and providing an output of said NOR gate to a one-shot generation apparatus.

3. An apparatus for storing data wherein the read after write access time is no greater than the read after read access time, comprising:

a static random access memory (SRAM) including at least one memory cell having a write line on which data can be written into said memory cell, and a read line from which data can be read from said memory cell;

at least one data line for transmitting data signals to the at least one memory cell in said SRAM;

at least one address line for selecting said at least one memory cell in said SRAM; and at least one enable line for enabling said at least one memory cell in said SRAM;

a data buffer connected to said conductive grid for temporarily storing data to be written into said SRAM; and means connected to said memory cell for monitoring said at least one data line and said write line and for generating a first internal write pulse representing the start of a write cycle in response to a change of state in a write signal on said write line and for generating a second internal write pulse in response to a change of state in a data signal on said at least one data line while said write signal is in a present state.

4. The apparatus of claim 3 wherein said means for generating a second internal write pulse further comprises a one-shot generation circuit for providing a one-shot pulse to the at least one memory cell such that said data signal is stored in the static memory device in response to said one-shot pulse.

5. The apparatus of claim 4 wherein said one-shot generation circuit further comprises a delay/inverter circuit for providing a delay and an inversion of a resulting signal generated by said means for indicating when a change of state occurs in said data signal.

6. The apparatus of claim 3 wherein the means connected to said memory cell for monitoring said at least one data line and said at least one write line and for generating a first internal write pulse and a second internal write pulse, comprises:

a first NOR gate having a first input for receiving the write signal, a second input for receiving the data signal, and an output;

a first inverter connected to said output of said first NOR gate for providing an inverter output signal which is an inversion of said output of said NOR gate;

first delay means connected to said first inverter for delaying said inverter output signal received from said first inverter and providing a one-shot input signal;

a first delay path connected to said first delay means for generating one-shot pulses including, a first path NOR gate having a first input for receiving a delayed write signal, a second input for receiving said one-shot input signal, and an output, a first delay/inverter connected to said output of said first path NOR gate for delaying and inverting a signal received therefrom, a first path NAND gate having a first input connected to said output of said first path NOR gate, a second input connected to said first delay/inverter, and an output, and a first path inverter connected to said output of said first path NAND gate for inverting a signal received therefrom;

a one-shot input signal inverter connected to said first delay means for inverting a signal output by said first delay means; and a second delay path for generating one-shot pulses including, a second path NOR gate having a first input for receiving said delayed write signal, a second input for receiving an output of said one-shot input signal inverter and an output, a second delay/inverter connected to said output of said second path NOR gate for delaying and inverting a signal received therefrom, a second path NAND gate having a first input connected to said output of said second path NOR gate, a second input connected to said second delay/inverter, and an output, and a second path inverter connected to said output of said first path NAND gate for inverting a signal received therefrom.

7. A static random access memory comprising:
at least one memory cell;
a word line connected to the memory cell;
a first and a second bit line connected to the memory cell;
a first switch connected to the first bit line and for receiving a first pulse enabling data to be written to the memory cell on the first bit line;
a second switch connected to the second bit line for receiving a second pulse enabling data to be written to the memory cell on the second bit line; and
a control line for supplying signals to the first switch and the second switch to control the supply of pulses to the memory cell.

8. A SRAM as in claim 7 wherein each of the first and second switches comprise a field effect transistor having a gate connected to an enable line for receiving enable signals enabling data to be written in the at least one memory cell during a write cycle.

* * * * *